United States Patent
So et al.

(10) Patent No.: US 7,283,414 B1
(45) Date of Patent: Oct. 16, 2007

(54) METHOD FOR IMPROVING THE PRECISION OF A TEMPERATURE-SENSOR CIRCUIT

(75) Inventors: Kenneth So, Belmont, CA (US); Ali Al-Shamma, Mountain View, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 11/441,389

(22) Filed: May 24, 2006

(51) Int. Cl.
G11C 7/04 (2006.01)

(52) U.S. Cl. ............................. 365/211; 365/189.07
(58) Field of Classification Search ............... 365/211, 365/189.07, 207, 210
See application file for complete search history.

(56) References Cited

U.S. PATENT DOCUMENTS

| | | |
|---|---|---|
| 3,851,316 A | 11/1974 | Kodama |
| 4,592,027 A | 5/1986 | Masaki |
| 4,646,266 A | 2/1987 | Ovshinsky et al. |
| 4,646,269 A | 2/1987 | Wong et al. |
| 4,698,788 A | 10/1987 | Flannagan et al. |
| 4,744,061 A | 5/1988 | Takemae et al. |
| 4,873,669 A | 10/1989 | Furutani et al. |
| 5,107,139 A | 4/1992 | Houston et al. |
| 5,149,199 A | 9/1992 | Kinoshita et al. |
| 5,276,644 A | 1/1994 | Pascucci et al. |
| 5,276,649 A | 1/1994 | Hoshita et al. |
| 5,278,796 A | 1/1994 | Tillinghast et al. |
| 5,359,571 A | 10/1994 | Yu |
| 5,383,157 A | 1/1995 | Phelan |
| 5,410,512 A | 4/1995 | Takase et al. |
| 5,652,722 A | 7/1997 | Whitefield |
| 5,784,328 A | 7/1998 | Irrinki et al. |
| 5,818,748 A | 10/1998 | Bertin et al. |
| 5,835,396 A | 11/1998 | Zhang |
| 5,890,100 A | 3/1999 | Crayford |
| 5,923,588 A | 7/1999 | Iwahashi |
| 5,925,996 A | 7/1999 | Murray |
| 5,940,340 A | 8/1999 | Ware et al. |
| 5,961,215 A | 10/1999 | Lee et al. |
| 5,977,746 A | 11/1999 | Hershberger et al. |
| 6,034,882 A | 3/2000 | Johnson et al. |
| 6,034,918 A | 3/2000 | Farmwald et al. |
| 6,055,180 A | 4/2000 | Gudesen et al. |
| 6,070,222 A | 5/2000 | Farmwald et al. |
| 6,157,244 A | 12/2000 | Lee et al. |

(Continued)

OTHER PUBLICATIONS

"A 14ns 1Mb CMOS SRAM with Variable Bit-Organization," Wada et al., 1988 IEEE International Solid-State Circuits Conference, pp. 252-253 (Feb. 19, 1988).

(Continued)

Primary Examiner—Son Dinh
(74) Attorney, Agent, or Firm—Brinks Hofer Gilson & Lione

(57) ABSTRACT

The preferred embodiments described below provide a method and memory device for improving the precision of a temperature-sensor circuit. In one preferred embodiment, first and second temperature-dependent reference voltages are generated and compared, and an operating condition of the memory array is controlled based on the result of the comparison. Instead of using a temperature-dependent reference voltage, a temperature-dependent reference current can be used. Other embodiments are disclosed, and each of the embodiments can be used alone or together in combination.

16 Claims, 5 Drawing Sheets

U.S. PATENT DOCUMENTS

| | | |
|---|---|---|
| 6,185,121 B1 | 2/2001 | O'Neill |
| 6,185,712 B1 | 2/2001 | Kirihata et al. |
| 6,205,074 B1 | 3/2001 | Van Buskirk et al. |
| 6,208,545 B1 | 3/2001 | Leedy |
| 6,212,121 B1 | 4/2001 | Ryu et al. |
| 6,236,587 B1 | 5/2001 | Gudesen et al. |
| 6,240,046 B1 | 5/2001 | Proebsting |
| 6,246,610 B1 | 6/2001 | Han et al. |
| 6,335,889 B1 | 1/2002 | Onodera |
| 6,356,485 B1 | 3/2002 | Proebsting |
| 6,373,768 B2 | 4/2002 | Woo et al. |
| 6,385,074 B1 | 5/2002 | Johnson et al. |
| 6,407,953 B1 | 6/2002 | Cleeves |
| 6,420,215 B1 | 7/2002 | Knall et al. |
| 6,424,581 B1 | 7/2002 | Bosch et al. |
| 6,507,238 B1 | 1/2003 | Yang |
| 6,525,953 B1 | 2/2003 | Johnson |
| 6,560,152 B1 | 5/2003 | Cernea |
| 6,577,549 B1 | 6/2003 | Tran et al. |
| 6,661,730 B1 | 12/2003 | Scheuerlein et al. |
| 6,697,283 B2 | 2/2004 | Marotta et al. |
| 6,724,665 B2 | 4/2004 | Scheuerlein et al. |
| 6,735,546 B2 | 5/2004 | Scheuerlein |
| 6,754,124 B2 | 6/2004 | Seyyedy et al. |
| 6,894,936 B2 | 5/2005 | Scheuerlein et al. |
| 6,954,394 B2 | 10/2005 | Knall et al. |
| 7,057,958 B2 * | 6/2006 | So et al. ............ 365/211 |
| 2002/0028541 A1 | 3/2002 | Lee et al. |
| 2002/0136045 A1 | 9/2002 | Scheuerlein |
| 2002/0136047 A1 | 9/2002 | Scheuerlein |
| 2003/0043643 A1 | 3/2003 | Scheuerlein et al. |
| 2003/0155650 A1* | 8/2003 | Moon et al. ............ 257/725 |
| 2006/0133125 A1 | 6/2006 | So et al. |

OTHER PUBLICATIONS

"64M×8 Bit NAND Flash Memory," Samsung Electronics (Oct. 27, 2000).

"How Flash Memory Works," wysiwyg://8/http://www.howstuffworks.com/flash-memory/htm?printable=1, 5 pages (1998).

"Datalight FlashFX.TM. 4.06 User's Guide," p. 11 (Aug. 2000).

"How Does TrueFFS.RTM. manage Wear Leveling?," http://www.m-sys.com/content/information/calcInfo.asp, 2 pages (printed Oct. 5, 2001).

"A CMOS Bandgap Reference Circuit with Sub-1V Operation," IEEE Journal of Solid-State Circuits, vol. 34, No. 5, May 1999, pp. 670-674.

"Sub-1V CMOS Proportional to Absolute Temperature References," IEEE Journal of Solid-State Circuits, vol. 38, No. 1, Jan. 2003, pp. 85-89.

"The flash memory read path: building blocks and critical aspects," Micheloni et al., Proceedings of the IEEE, vol. 91, No. 4, Apr. 2003, pp. 537-553.

"A current-based reference-generations scheme for 1T-1C ferroelectric random-access memories," Siu et al., IEEE Journal of Solid-State Circuits, vol. 38, Issue 3, Mar. 2003, pp. 541-549.

* cited by examiner

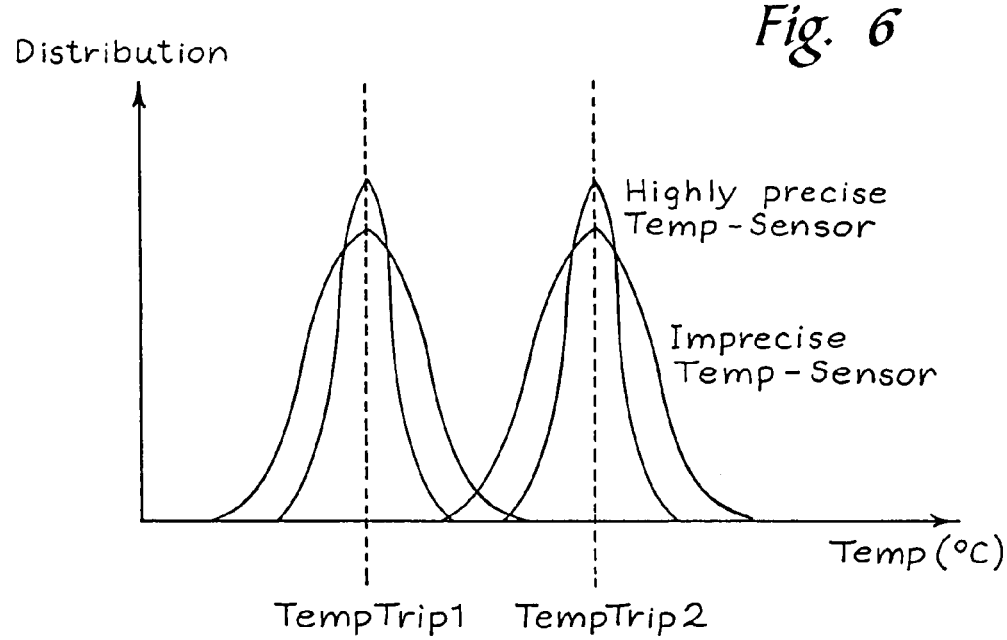
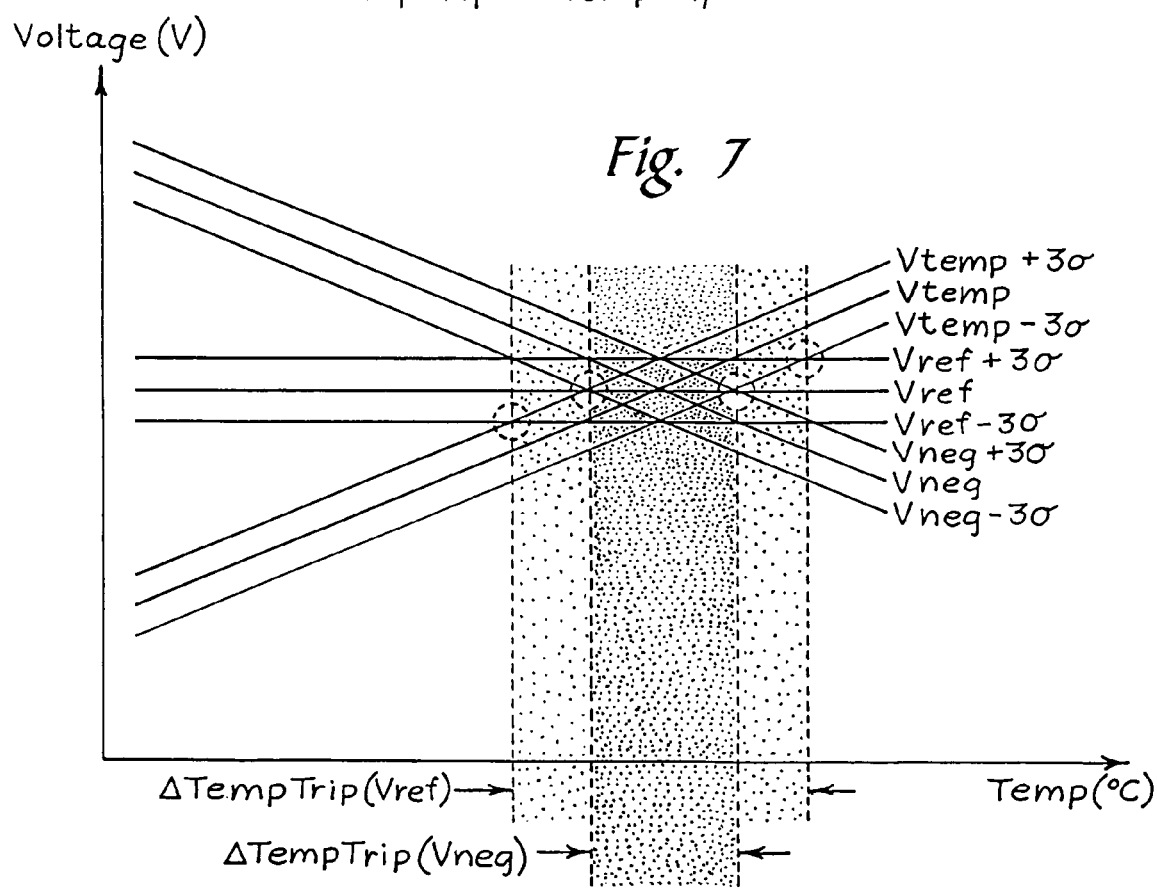

METHOD FOR IMPROVING THE PRECISION OF A TEMPERATURE-SENSOR CIRCUIT

BACKGROUND

High programming bandwidth and low power consumption are desired in memory devices to meet customer requirements. However, as temperature increases, the average power consumption by the memory increases, and, as programming bandwidth increases, the average power consumption by the memory also increases.

FIG. 1 is a graph showing two operating zones of a prior art memory device. In Zone 0 (temperatures between 0° C. and "TempTrip"), the memory array operates at nominal programming bandwidth. In Zone 1 (temperatures greater than "TempTrip"), the memory array shuts down (i.e., the programming bandwidth goes to 0). In operation, a proportional-to-absolute-temperature (PTAT) voltage source is used to generate a temperature-dependent reference voltage with a positive temperature coefficient (Vtemp). This temperature-dependent reference voltage is compared to a temperature-independent reference voltage (Vref), typically a bandgap voltage reference. As shown in FIG. 1, Vtemp is greater than Vref at TempTrip. Accordingly, when Vtemp is greater than Vref, a signal ("Vtrip") is generated to transition from Zone 0 to Zone 1 (i.e., if (Vtemp>Vref) then Vtrip=high, else Vtrip=low). The precision of the temperature sensing circuit depends on the deviation of Vref and Vtemp from ideal conditions. As shown in FIG. 2, a range of ±3σ of Vref and Vtemp results in a relatively large temperature range in which the transition from one zone to another can occur (i.e., ΔTempTrip(Vref)=(ΔVtemp+ΔVref)/slope(Vtemp)). This relatively large temperature range may be undesirable in applications that require a more precise temperature sensing circuit.

There is a need, therefore, a method and memory device for improving the precision of a temperature-sensor circuit.

SUMMARY

The present invention is defined by the following claims, and nothing in this section should be taken as a limitation on those claims.

By way of introduction, the preferred embodiments described below provide a method and memory device for improving the precision of a temperature-sensor circuit. In one preferred embodiment, first and second temperature-dependent reference voltages are generated and compared, and an operating condition of the memory array is controlled based on the result of the comparison. Instead of using a temperature-dependent reference voltage, a temperature-dependent reference current can be used. Other embodiments are disclosed, and each of the embodiments can be used alone or together in combination.

The preferred embodiments will now be described with reference to the attached drawings.

BRIEF DESCRIPTION OF THE DRAWINGS

FIG. 6 is a graph showing distribution versus temperature.

FIG. 7 is a graph showing a temperature range for a programming bandwidth transition of a memory device of a preferred embodiment.

DETAILED DESCRIPTION OF THE PRESENTLY PREFERRED EMBODIMENTS

Figure 3:
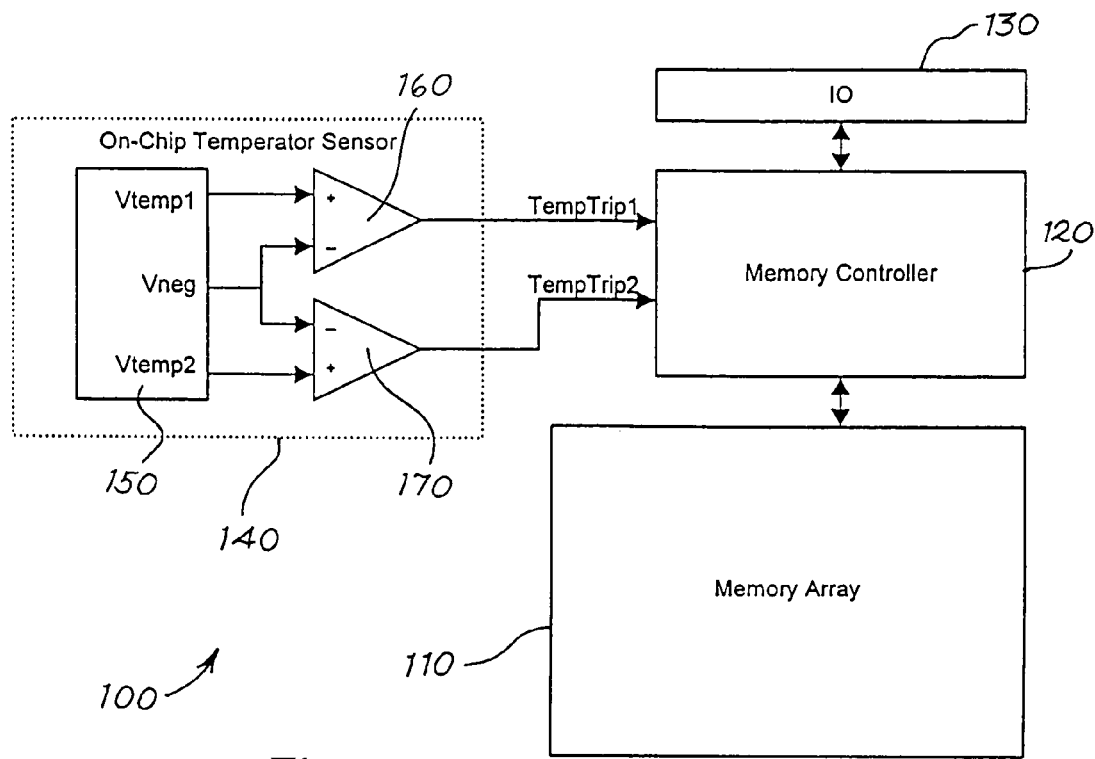
FIG. 3 is a block diagram of a memory device of a preferred embodiment.

Turning now to the drawings, FIG. 3 is a block diagram of a memory device 100 of a preferred embodiment. As shown in FIG. 3, the memory device 100 comprises a memory array 110, a memory controller 120, an input-output ("IO") port 130, and an on-chip temperature sensor 140. The on-chip temperature sensor 140 comprises a set of voltage generators 150 and first and second comparators 160, 170. The temperature sensor 140 is "on-chip" in this embodiment because it is integrated with the memory array 110 on the same chip that contains the memory array. Other components of the memory device 100 are not shown to simplify the drawing.

The memory array 110 comprises a plurality of memory cells. It should be noted that any suitable type of memory cell can be used. For example, the memory cell can be write-many or write-once, can be arranged in a two-dimensional or three-dimensional memory array, and can be made from any suitable material (e.g., semiconductor, phase-change, amorphous solids, MRAM, or organic passive elements). U.S. Pat. No. 6,881,994 describes a suitable write-many memory cell, and U.S. Pat. Nos. 6,034,882 and 6,420,215 describe suitable write-once memory cells, as well as suitable techniques for forming a three-dimensional memory array. Each of those patent documents is assigned to the assignee of the present invention and is hereby incorporated by reference. It should be noted that the memory cells described in these patent documents are merely some example of the types of memory cells that can be used and that other type of memory cells, such as Flash memory cells, can be used with these embodiments. Further, while the embodiments will be described in terms of a non-volatile memory cell, volatile memory cells can also be used. The following claims should not be read as requiring a specific type of memory cell unless explicitly recited therein.

The memory controller 120 controls the operation of the memory array 110. One of the functions of the memory controller 120 is to control the operating condition of the memory array 110 based on temperature. The memory controller 120 can have other functionality, which is not described herein to simplify this illustration. The ways in which the memory controller 120 can control the operating condition of the memory array 110 include, but are not limited to, controlling the programming bandwidth of the memory array 110, controlling the reading bandwidth of the memory array 110, changing the voltage across a memory cell for read (e.g., as temperature increases, reduce the voltage), changing the voltage across a memory cell for write (e.g., as temperature increases, reduce the voltage), controlling the sensing current for read (e.g., as temperature increases, increase the current; as temperature decreases, decrease the current), and controlling the sense time for read (e.g., as temperature decreases, increase the sense time). Controlling programming bandwidth will be used to illustrate this embodiment; however, the claims should not be limited to this or any other example unless explicitly recited therein.

Figure 4:
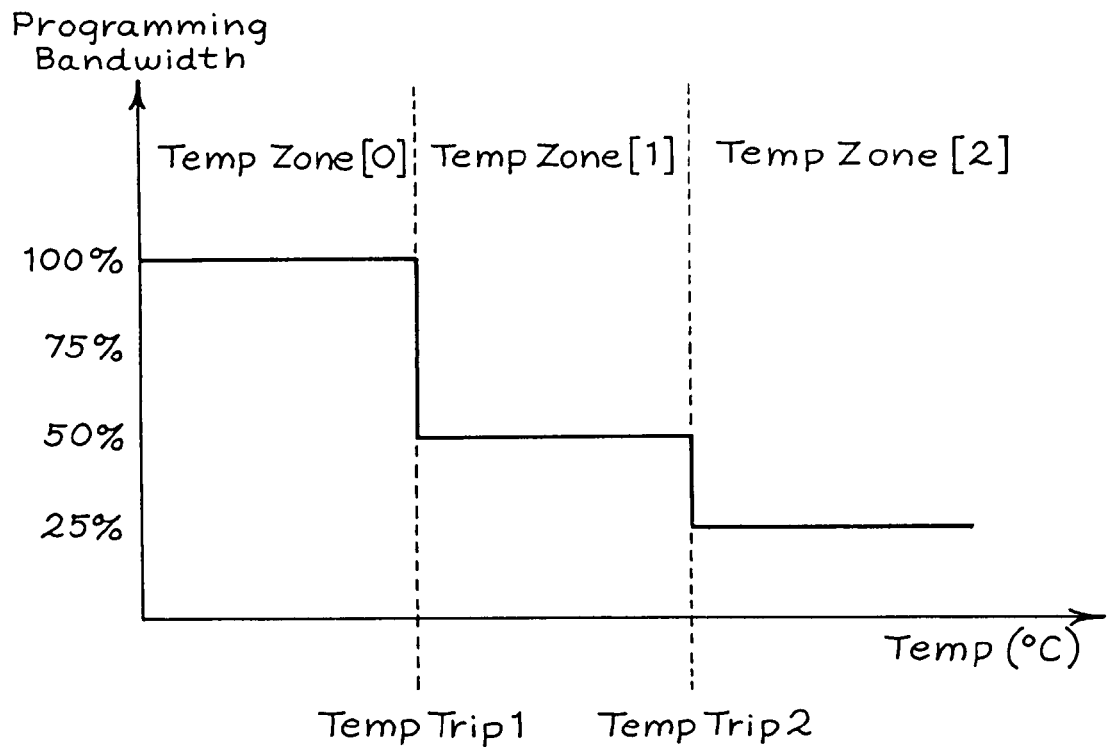
FIG. 4 is a graph of a temperature-dependent programming bandwidth scheme used by a memory controller of a preferred embodiment.

FIG. 4 is a graph showing the operation of the memory controller 120 in controlling programming bandwidth based on temperature. In this embodiment, the programming bandwidth is linearly proportional to the number of bits that are programmed at the same time and is controlled by the memory controller 120. As shown in FIG. 4, the memory controller 120 operates in three temperature zones: Temp Zone [0], Temp Zone [1], and Temp Zone [2]. Of course, fewer or more zones can be used. The transition between Temp Zone [0] and Temp Zone [1] occurs at TempTrip1 (which, in this preferred embodiment, is 45° C.), and the transition between Temp Zone [1] and Temp Zone [2] occurs at TempTrip2 (which, in this preferred embodiment, is 75° C.). In Temp Zone [0], the programming bandwidth is 100% (in this preferred embodiment, 10 MB/sec), which is the maximum speed that the memory controller 120 can program the memory. In Temp Zone [1], the programming bandwidth is at 50% (in this preferred embodiment, 5 MB/sec). In Temp Zone [2], the programming bandwidth is at 25% (in this preferred embodiment, 2.5 MB/sec).

Figure 5:
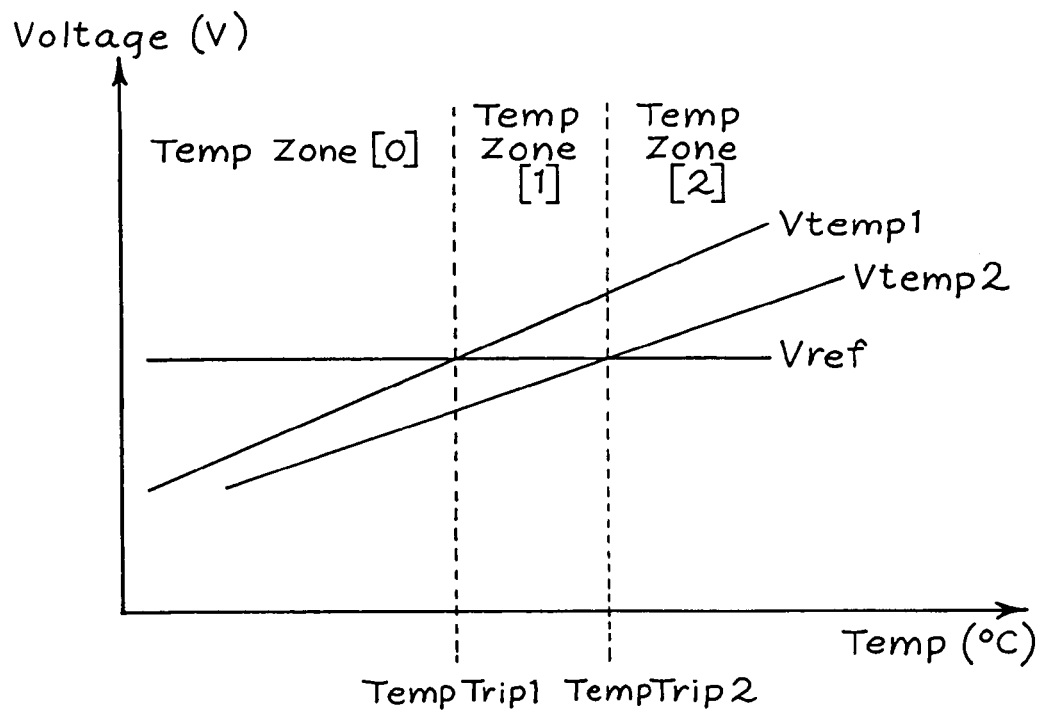
FIG. 5 is a graph showing three operating zones of memory array using a temperature-independent voltage source.

FIG. 5 is a graph showing how this operation can be implemented using an temperature-independent reference voltage. In operation, proportional-to-absolute-temperature (PTAT) voltage sources generate two temperature-dependent reference voltages with different positive temperature coefficients: Vtemp1 and Vtemp2. These temperature-dependent reference voltages are compared to a temperature-independent reference voltage (Vref), typically a bandgap voltage reference. However, using such a temperature-sensor circuit that compares a bandgap voltage reference to a temperature-dependent reference voltage with a positive temperature coefficient may not be precise enough for multi-level temperature trip points because of the relatively large temperature range in which the transition from one programming bandwidth to another can occur. In general, the closer the temperature trip points, the higher the desired precision. With a relatively large temperature range, two memory devices can behave differently at the same temperature (e.g., the programming bandwidth can be different in two of the same parts at the same temperature). This is shown in the distribution graph of FIG. 6. This can have ramifications on how a memory device manufacturer defines the product specification and on production testing (i.e., requiring further temperature screening).

To overcome this problem, in this embodiment, instead of comparing a temperature-dependent reference voltage with a positive temperature coefficient to a temperature-independent bandgap reference voltage, a temperature-dependent reference voltage with a positive temperature coefficient is compared to a temperature-dependent reference voltage with a negative temperature coefficient. With reference again to FIG. 3, the set of voltage generators 150 in the on-chip temperature sensor 140 generates two temperature-dependent reference voltages with positive temperature coefficients (Vtemp1 and Vtemp2) and a temperature-dependent reference voltage with a negative temperature coefficient (Vneg). The first comparator 160 compares Vtemp1 and Vneg and asserts a TempTrip1 signal to the memory controller 120 when Vtemp1 is greater than Vneg. Similarly, the second comparator 170 compares Vtemp2 and Vneg and asserts a TempTrip2 signal to the memory controller 120 when Vtemp2 is greater than Vneg.

Figure 1:
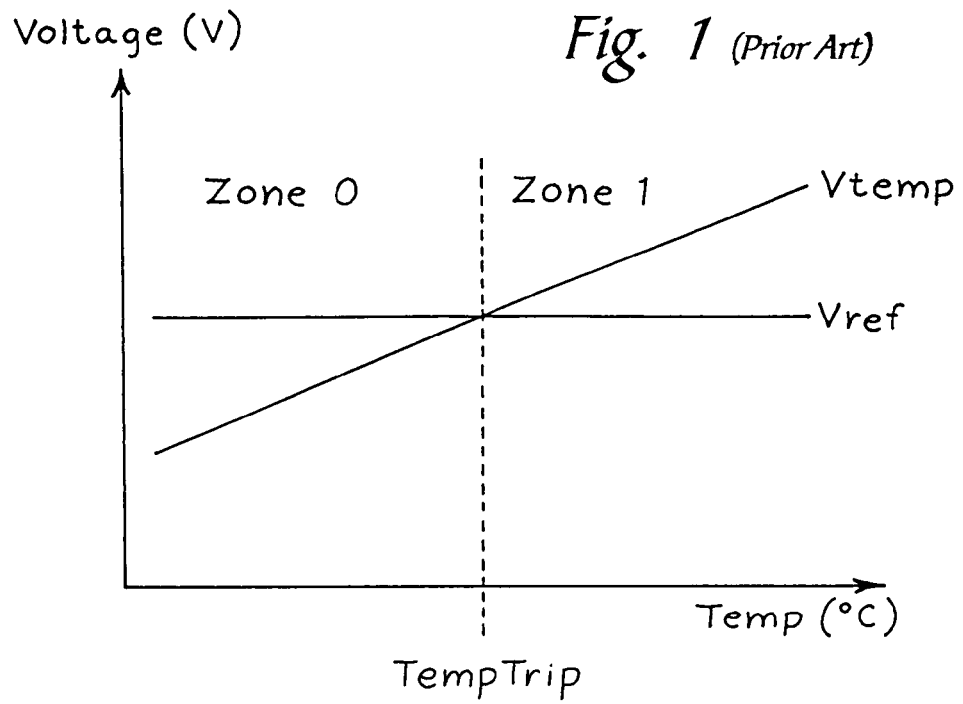
FIG. 1 is a graph showing two operating zones of a prior art memory array.
Figure 2:
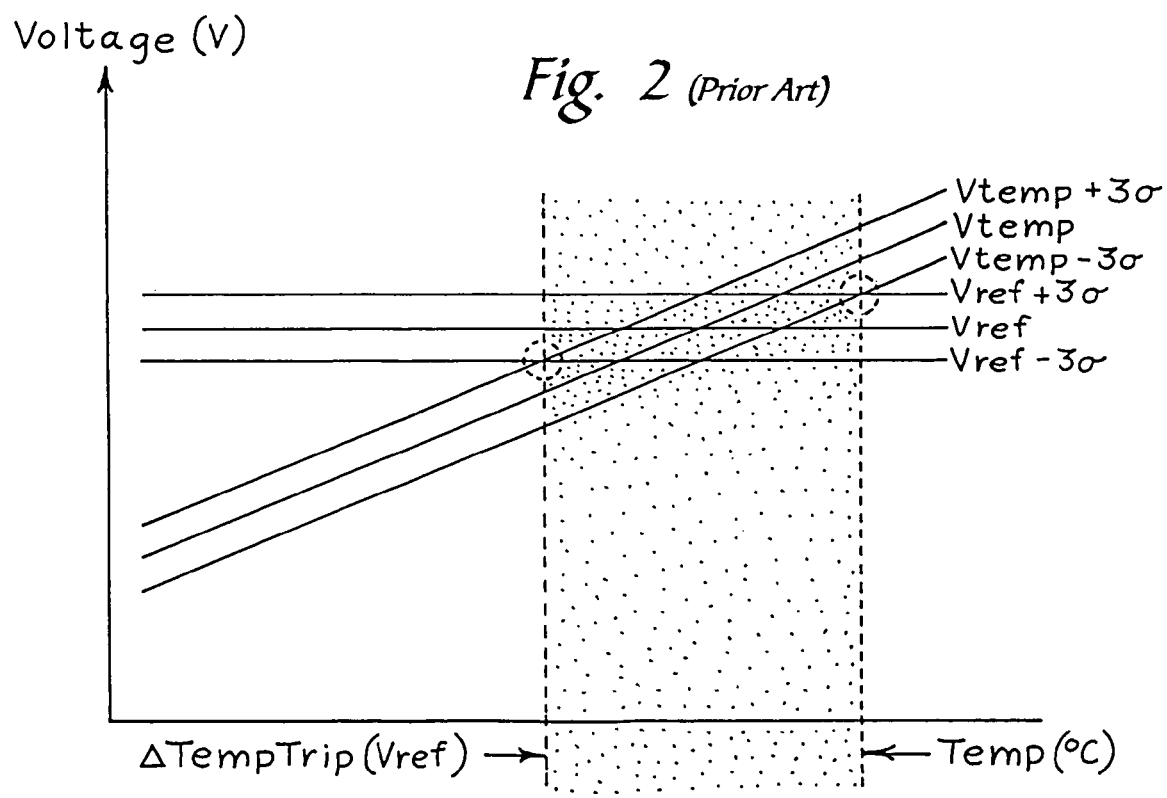
FIG. 2 is a graph showing a temperature range for zone transition of a prior art memory device.
Figure 8:
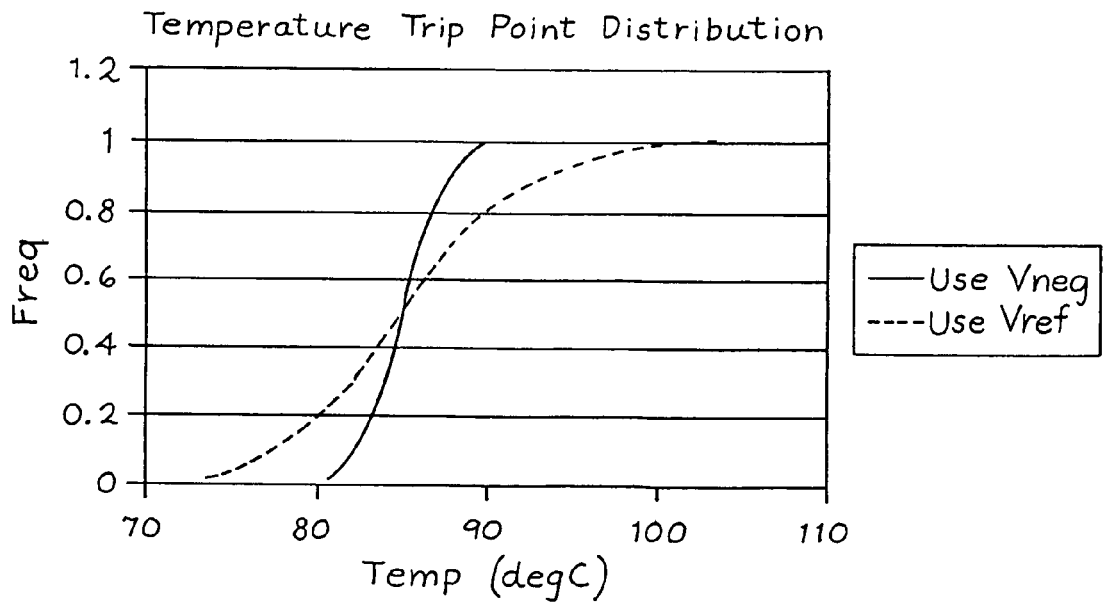
FIG. 8 is a graph showing distribution versus temperature of a preferred embodiment.

Comparing Vtemp to Vneg instead of to Vref provides a more precise temperature sensing mechanism. This is illustrated in the graph shown in FIG. 7. FIG. 7 is a graph showing Vref, Vtemp, and Vneg and a range of ±3σ of each of those values. As mentioned above in conjunction with FIG. 2, the temperature range in which the TempTrip signal is generated when Vtemp is compared to Vref is given by the following equation: ΔTempTrip(Vref)=(ΔVtemp+ΔVref)/slope(Vtemp)). However, as shown in FIG. 7, there is a smaller temperature range when Vtemp is compared to Vneg. Accordingly, the temperature range in which the TempTrip signal is generated when Vtemp is compared to Vneg is given by the following equation: ΔTempTrip(Vneg)=(ΔVtemp+ΔVneg)/(slope(Vtemp)−slope(Vneg)). As shown in the graph, ΔTempTrip(Vneg)<ΔTempTrip(Vref), which means that comparing Vtemp to Vneg provides a more precise temperature sensing mechanism than comparing Vtemp to Vref. With a more precise temperature sensing mechanism, it is more likely that any two memory devices will behave similarly at the same temperature (e.g., the programming bandwidth is more likely to be the same in two of the same parts at the same temperature). This is shown in the distribution graph of FIG. 8, which was generated using a method of generating random variables from a known distribution (e.g., a Gaussian distribution). FIG. 8 shows that the distribution is more dispersed when Vtemp is compared to Vref (the "Use Vref" case) than when Vtemp is compared to Vneg (the "Use Vneg" case).

Figure 9:
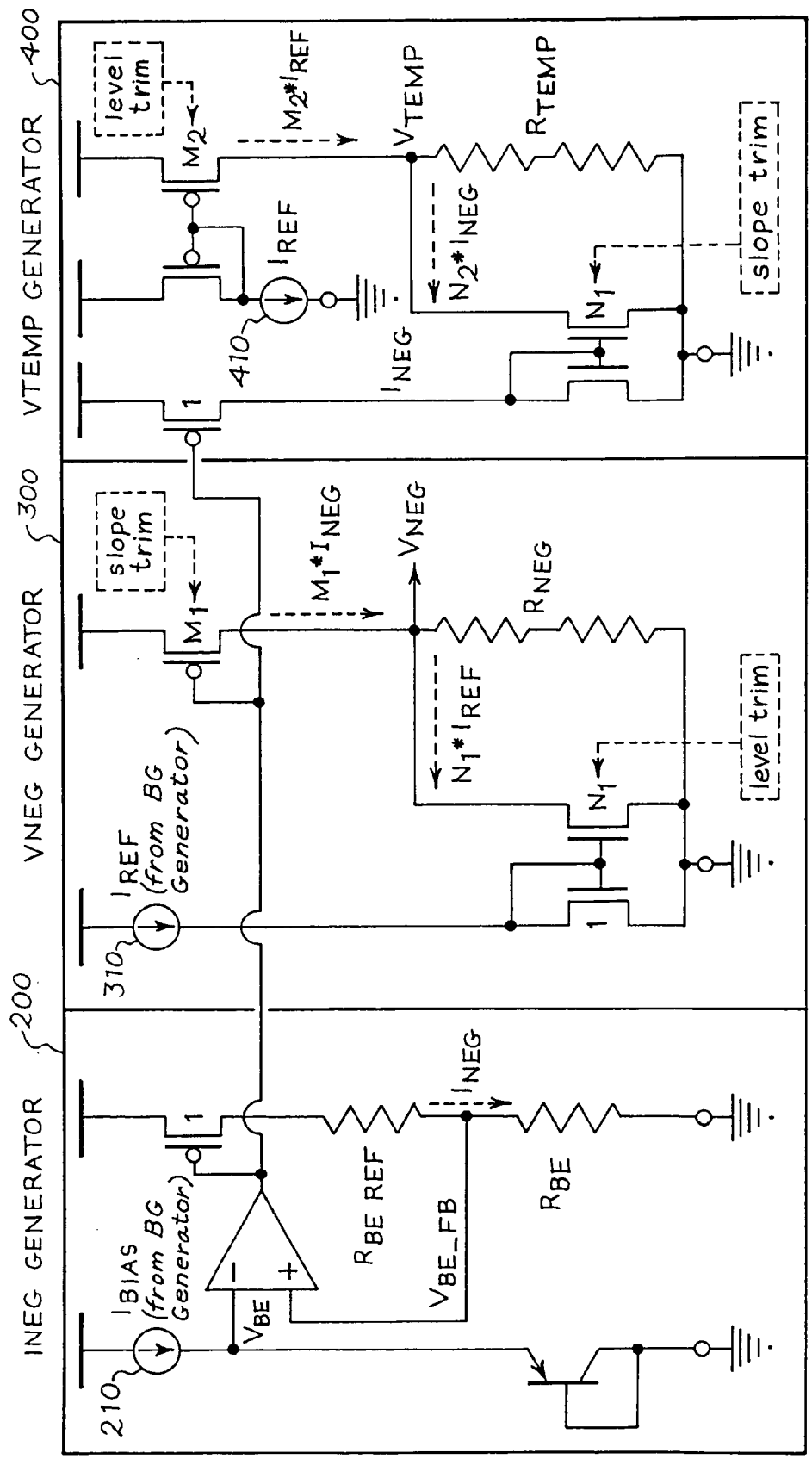
FIG. 9 is a circuit implementation of Vneg and Vtemp generators of a memory device of a preferred embodiment.

In a preferred embodiment, Vtemp is generated from a proportional-to-absolute-temperature (PTAT) voltage source, and Vneg is generated from a complementary-to-absolute-temperature (CTAT) voltage source (i.e., Vneg). Although Vtemp and Vneg can be generated in any suitable manner, FIG. 9 is a circuit implementation of Vtemp and Vneg generators of a preferred embodiment. FIG. 9 shows an Ineg generator 200, a Vneg generator 300, and a Vtemp generator 400. In this embodiment, Vneg and Vtemp are generated from two independent current sources: the Ibias generator 210 and the $I_{NEG}$ generators 310, 410. Iref and Ibias are constant current references that can be generated from two independent current sources that are well matched.

The circuitry shown in FIG. 9 is governed by the following equations:

$$V_{BE\_FB}=V_{BE}, V_{BE}=V_T*\ln(I_{BIAS}/I_S)$$

$$I_{NEG}=V_{BE\_FB}/R_{BE}=V_{BE}/R_{BE}$$

$$I_{REF}=I_{BIAS}=\text{constant}$$

$$V_{NEG}=(M_1*I_{NEG}-N_1*I_{REF})*R_{NEG}$$

$$V_{TEMP}=(M_2*I_{REF}-N_2*I_{NEG})*R_{TEMP}$$

$$\delta V_{BE}/\delta T=(V_{BE}-(4+m)V_T-E_g/q)/T\sim=2E^{-3}V/°\text{ C.}$$

$$\delta I_{NEG}/\delta T=-2E^{-3}/R_{BE}V/°\text{ C.}$$

$$\delta I_{REF}/\delta T=0$$

$$\delta V_{NEG}/\delta T=M_1*(-2E^{-3})*(R_{NEG}/R_{BE})V/°\text{ C.}$$

$$\delta V_{TEMP}/\delta T=-N_2*(-2E^{-3})*(R_{TEMP}/R_{BE})V/°\text{ C.}$$

It should be noted that while FIG. 9 shows one possible circuit implementations, other implementations can be used.

There are several alternatives that can be used with these embodiments. For example, in the embodiment described above, two Vtemp voltages are used because that embodiment uses three zones. If two zones are used, only one Vtemp voltage may be generated. Likewise, if more than three zones are used, more than two Vtemp voltages may be generated. Also, instead of generating two positive temperature coefficient reference voltages and a single negative temperature coefficient reference voltage, the set of voltage generators 150 can generate a single positive temperature coefficient reference voltage and two negative temperature coefficient reference voltages. In yet another alternative embodiment, instead of using a temperature-dependent reference voltage, a temperature-dependent reference current can be used.

It is intended that the foregoing detailed description be understood as an illustration of selected forms that the invention can take and not as a definition of the invention. It is only the following claims, including all equivalents, that are intended to define the scope of this invention. Finally, it should be noted that any aspect of any of the preferred embodiments described herein can be used alone or in combination with one another.

What is claimed is:

1. A method for controlling an operating condition of a memory array based on temperature, the method comprising:
    (a) generating a first temperature-dependent reference voltage comprising a negative temperature coefficient;
    (b) generating a second temperature-dependent reference voltage comprising a positive temperature coefficient;
    (c) comparing the first temperature-dependent reference voltage with the second temperature-dependent reference voltage; and
    (d) controlling an operating condition of a memory array based on a result of the comparison of the first and second temperature-dependent reference voltages.

2. The method of claim 1 further comprising:
    generating a third temperature-dependent reference voltage comprising a positive temperature coefficient; and
    comparing the first temperature-dependent reference voltage with the third temperature-dependent reference voltage;
    wherein (d) comprises controlling an operating condition of the memory array based on the comparison of the first and second temperature-dependent reference voltages and the comparison of the first and third temperature-dependent reference voltages.

3. The method of claim 1, wherein (d) comprises controlling a programming bandwidth of the memory array based on a result of the comparison of the first and second temperature-dependent reference voltages.

4. The method of claim 3, wherein (d) comprises reducing programming bandwidth of the memory array if the second temperature-dependent reference voltage is greater than the first temperature-dependent reference voltage.

5. The method of claim 1, wherein (d) comprises controlling a read bandwidth of the memory array based on a result of the comparison of the first and second temperature-dependent reference voltages.

6. The method of claim 1, wherein (d) comprises controlling a voltage across a memory cell for read based on a result of the comparison of the first and second temperature-dependent reference voltages.

7. The method of claim 1, wherein (d) comprises controlling a voltage across a memory cell for write based on a result of the comparison of the first and second temperature-dependent reference voltages.

8. The method of claim 1, wherein (d) comprises controlling a sensing current for read based on a result of the comparison of the first and second temperature-dependent reference voltages.

9. The method of claim 1, wherein (d) comprises controlling a sensing time for read based on a result of the comparison of the first and second temperature-dependent reference voltages.

10. A method for controlling an operating condition of a memory array based on temperature, the method comprising:
    (a) generating a first temperature-dependent reference current comprising a negative temperature coefficient;
    (b) generating a second temperature-dependent reference current comprising a positive temperature coefficient;
    (c) comparing the first temperature-dependent reference current with the second temperature-dependent reference current; and
    (d) controlling an operating condition of a memory array based on a result of the comparison of the first and second temperature-dependent reference currents.

11. The method of claim 10, wherein (d) comprises controlling a programming bandwidth of the memory array based on a result of the comparison of the first and second temperature-dependent reference currents.

12. The method of claim 11, wherein (d) comprises controlling a read bandwidth of the memory array based on a result of the comparison of the first and second temperature-dependent reference currents.

13. The method of claim 10, wherein (d) comprises controlling a voltage across a memory cell for read based on a result of the comparison of the first and second temperature-dependent reference currents.

14. The method of claim 10, wherein (d) comprises controlling a voltage across a memory cell for write based on a result of the comparison of the first and second temperature-dependent reference currents.

15. The method of claim 10, wherein (d) comprises controlling a sensing current for read based on a result of the comparison of the first and second temperature-dependent reference currents.

16. The method of claim 10, wherein (d) comprises controlling a sensing time for read based on a result of the comparison of the first and second temperature-dependent reference currents.

* * * * *